(12) United States Patent
Miyazawa

(10) Patent No.: US 9,899,804 B2
(45) Date of Patent: Feb. 20, 2018

(54) SEMICONDUCTOR APPARATUS

(71) Applicant: FUJI ELECTRIC CO., LTD., Kanagawa (JP)

(72) Inventor: Shigemi Miyazawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/364,261

(22) Filed: Nov. 30, 2016

(65) Prior Publication Data
US 2017/0222407 A1 Aug. 3, 2017

(30) Foreign Application Priority Data
Jan. 29, 2016 (JP) .................................. 2016-016517

(51) Int. Cl.
| | | |
|---|---|---|
| *H01T 15/00* | (2006.01) | |
| *H01L 29/06* | (2006.01) | |
| *H01L 29/739* | (2006.01) | |
| *H01L 29/78* | (2006.01) | |

(52) U.S. Cl.
CPC .......... *H01T 15/00* (2013.01); *H01L 29/0623* (2013.01); *H01L 29/7395* (2013.01); *H01L 29/7802* (2013.01)

(58) Field of Classification Search
None
See application file for complete search history.

(56) References Cited

U.S. PATENT DOCUMENTS

| | | | | | |
|---|---|---|---|---|---|
| 4,275,701 | A | * | 6/1981 | Arguello | F02P 3/0435 123/146.5 A |
| 4,440,130 | A | * | 4/1984 | Taguchi | F02P 3/0453 123/406.66 |
| 4,492,213 | A | * | 1/1985 | Yamamoto | F02P 3/051 123/623 |
| 4,931,940 | A | * | 6/1990 | Ogawa | F02D 41/009 701/101 |
| 5,603,308 | A | * | 2/1997 | Ooyabu | H03K 17/0406 123/644 |
| 5,783,908 | A | * | 7/1998 | Toda | H05B 41/2921 315/224 |
| 6,539,929 | B2 | * | 4/2003 | Ito | F02P 3/053 123/630 |
| 6,814,066 | B2 | * | 11/2004 | Ando | F02P 3/0435 123/630 |

(Continued)

*Primary Examiner* — Crystal L Hammond

(57) ABSTRACT

A semiconductor apparatus is provided, including a power semiconductor element, a cutoff condition detection portion which detects whether a predetermined cutoff condition is met, a reset portion which outputs a reset signal that instructs to reset during a predetermined period in response to an input of the control signal turning the power semiconductor element on, a latch portion which is reset in response to the reset signal and latches that an occurrence of the cutoff condition is detected after the reset, a cutoff circuit which controls the gate of the power semiconductor element to be at an OFF potential in response to the latching of the occurrence of the cutoff condition by the latch portion, and a prevention circuit which prevents the gate of the power semiconductor element from being at an ON potential during a period of reset of the latch portion even if the cutoff condition is met.

13 Claims, 10 Drawing Sheets

(56) References Cited

U.S. PATENT DOCUMENTS

| | | | | |
|---|---|---|---|---|
| 7,051,724 | B2* | 5/2006 | Uruno | F02P 3/051 |
| | | | | 123/644 |
| 7,301,129 | B1* | 11/2007 | Yabe | H01L 27/0248 |
| | | | | 219/497 |
| 8,402,954 | B2* | 3/2013 | Matsuda | F02P 9/005 |
| | | | | 123/143 B |
| 8,928,373 | B2* | 1/2015 | Miyazawa | H03K 3/57 |
| | | | | 327/142 |
| 9,229,521 | B2* | 1/2016 | Furuya | G06F 1/24 |
| 2004/0252432 | A1* | 12/2004 | Sasaki | B60K 6/485 |
| | | | | 361/91.1 |
| 2006/0022609 | A1* | 2/2006 | Yukutake | F02P 3/0552 |
| | | | | 315/209 T |
| 2006/0077000 | A1* | 4/2006 | Goudo | H03K 17/08122 |
| | | | | 327/434 |
| 2009/0139505 | A1* | 6/2009 | Naito | F02P 3/0552 |
| | | | | 123/644 |
| 2011/0031979 | A1* | 2/2011 | Gillberg | F02P 3/0554 |
| | | | | 324/546 |
| 2013/0241609 | A1* | 9/2013 | Miyazawa | H03K 3/57 |
| | | | | 327/142 |
| 2015/0048450 | A1* | 2/2015 | Naito | H01L 29/402 |
| | | | | 257/337 |

\* cited by examiner

SEMICONDUCTOR APPARATUS

The contents of the following Japanese patent application are incorporated herein by reference:
NO. 2016-016517 filed on Jan. 29, 2016.

BACKGROUND

1. Technical Field

The present invention relates to a semiconductor apparatus.

2. Related Art

Conventionally, a power semiconductor device dealing with a large power has been known as a semiconductor apparatus used for an ignition of an internal combustion engine and the like. It has been known that a circuit driving such a power semiconductor device includes a circuit that senses an abnormal state such as overheat of the power semiconductor device and the like to protect the internal combustion engine from influences (for example, refer to Patent Document 1).

Patent Document 1: Japanese Patent Application Publication No. 2013-194530

If the driving circuit of such a power semiconductor device continues operating in the abnormal state, it causes an occurrence of a malfunction and the like of the driving circuit as well as malfunctions of the internal combustion engine and the like connected to the driving circuit. Therefore, it has been desired that the driving circuit has a protection function that can reliably discontinue or stop operating if the abnormal state such as overheat of the power semiconductor device and the like is sensed.

SUMMARY

Here, in one aspect of a technological innovation included in the specification, one purpose is to provide a semiconductor apparatus which can solve the above-described problem. This purpose is achieved by combinations of features described in the claims. That is, in a first aspect of the present invention, a semiconductor apparatus is provided including a power semiconductor element in which a gate is controlled in response to a control signal, a cutoff condition detection portion which detects whether a predetermined cutoff condition is met, a reset portion which outputs, in response to an input of a control signal that turns the power semiconductor element on, a reset signal that instructs to reset during a predetermined period, a latch portion which is reset in response to the reset signal and latches that an occurrence of the cutoff condition is detected after the reset, a cutoff circuit which controls the gate of the power semiconductor element to be at an OFF potential in response to latching of the occurrence of the cutoff condition by the latch portion, and a prevention circuit which prevents the gate of the power semiconductor element from being at an ON potential during a period of reset of the latch portion even if the cutoff condition is met.

It should be noted that the summary clause of the above-described invention does not necessarily describe all necessary features of the present invention, and the present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the following embodiments are not necessarily essential to means provided by aspects of the invention.

Figure 1:
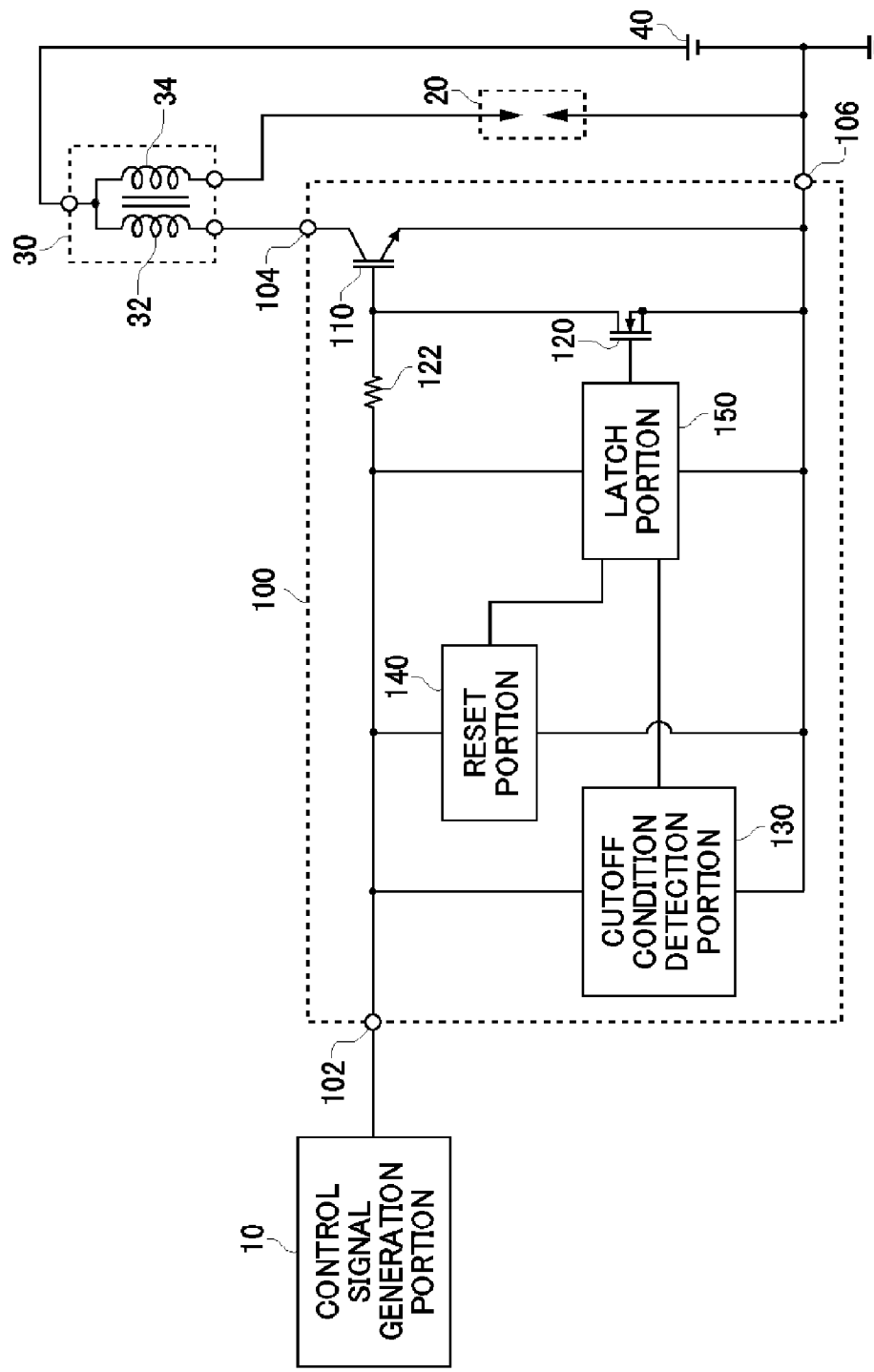
FIG. 1 shows a configuration example of an ignition apparatus 1000 according to the present embodiment.

FIG. 1 shows a configuration example of the ignition apparatus 1000 according to the present embodiment. The ignition apparatus 1000 ignites an ignition plug used for an internal combustion engine and the like of an automobile and the like. In the present embodiment, an example where the ignition apparatus 1000 is equipped to an engine of an automobile will be described. The ignition apparatus 1000 includes a control signal generation portion 10, an ignition plug 20, an ignition coil 30, a power source 40, and a semiconductor apparatus 100.

The control signal generation portion 10 generates a switching control signal that controls switching on and off of the semiconductor apparatus 100. For example, the control signal generation portion 10 is one part or all parts of an engine control unit (ECU) of an automobile where the ignition apparatus 1000 is equipped. The control signal generation portion 10 supplies the generated control signal to the semiconductor apparatus 100. The ignition apparatus 1000 initiates an igniting operation of the ignition plug 20 according to that the control signal generation portion 10 supplies the control signal to the semiconductor apparatus 100.

The ignition plug 20 electrically generates sparks by discharge. The ignition plug 20 discharges by an applied voltage equal to or greater than approximately 10 kV, for example. As one example, the ignition plug 20 is provided in an internal combustion engine, and, in this case, ignites combustible gas such as mixed air and the like in a combustion chamber. For example, the ignition plug 20 is provided in a through hole, which penetrates from outside of a cylinder to the combustion chamber inside of the cylinder, and is fixed so as to seal the through hole. In this case, one end of the ignition plug 20 is exposed within the combustion chamber and the other end receives an electrical signal from outside of the cylinder.

The ignition coil 30 supplies the electrical signal to the ignition plug. The ignition coil 30 supplies a high voltage as the electrical signal to discharge the ignition plug 20. The ignition coil 30 may function as a transformer, and, for example, is an ignition coil having a primary coil 32 and a secondary coil 34. One end of the primary coil 32 and one end of the secondary coil 34 are electrically connected. The primary coil 32 has a number of windings less than that of the secondary coil 34 and shares a core with the secondary coil 34. The secondary coil 34 generates an electromotive force (a mutual induced electromotive force) in response to an electromotive force occurring in the primary coil 32. The secondary coil 34 is connected to the ignition plug 20 on the other end and supplies the generated electromotive force to the ignition plug 20 to discharge the ignition plug 20.

The power source 40 supplies voltages to the ignition coil 30. For example, the power source 40 supplies a predetermined constant voltage Vb (as one example, 14V) to one end of the primary coil 32 and of the secondary coil 34. As one example, the power source 40 is a battery of an automobile.

The semiconductor apparatus 100 switches conduction and non-conduction between the other end of the primary coil 32 of the ignition coil 30 and a reference potential in response to the control signal supplied from the control signal generation portion 10. For example, the semiconductor apparatus 100 makes conductive between the primary coil 32 and the reference potential in response to the control signal of the high potential (ON potential), and make non-conductive between the primary coil 32 and the reference potential in response to the control signal of the low potential (OFF potential).

Here, the reference potential may be a reference potential in a control system of an automobile, or also may be a reference potential corresponding to the semiconductor apparatus 100 within the automobile. The reference potential may be a low potential to turn the semiconductor apparatus 100 off and, as one example, is 0V. The semiconductor apparatus 100 includes a control terminal 102, a first terminal 104, a second terminal 106, a power semiconductor element 110, a cutoff circuit 120, a resistor 122, a cutoff condition detection portion 130, a reset portion 140, and a latch portion 150.

The control terminal 102 inputs a control signal that controls the power semiconductor element 110. The control terminal 102 is connected to the control signal generation portion 10 and receives the control signal. The first terminal 104 is connected to the power source 40 via the ignition coil 30. The second terminal 106 is connected to the reference potential. That is, the first terminal 104 is a terminal on the high potential side compared with the second terminal 106, and the second terminal 106 is a terminal on the low potential side compared with the first terminal 104.

In the power semiconductor element 110, a gate is controlled in response to the control signal. The power semiconductor element 110 includes a gate terminal (G), a collector terminal (C) and an emitter terminal (E), and electrically connects or disconnects between the collector terminal and the emitter terminal in response to the control signal input in the gate terminal. The power semiconductor element 110 is connected between the first terminal 104 on the high potential side and the second terminal 106 on the low potential side and is controlled to be on or off in response to the gate potential. In the power semiconductor element 110, the gate potential is controlled in response to the control signal. As one example, the power semiconductor element 110 is an insulated gate bipolar transistor (IGBT). Also, the power semiconductor element 110 may be a MOSFET.

As one example, the power semiconductor element 110 withstands high pressures up to several hundreds of V. For example, the power semiconductor element 110 is a vertical device provided with a collector electrode formed on a first surface side of a substrate and with a gate electrode and an emitter electrode formed on a second surface side which is an opposite side to the first surface. Also, the power semiconductor element 110 may be a vertical MOSFET. As one example, the emitter terminal of the power semiconductor element 110 is connected to the reference potential. Also, the collector terminal is connected to the other end of the primary coil 32. It should be noted that in the embodiment, an example will be described, where the power semiconductor element 110 is an n channel type IGBT electrically connecting between the collector terminal and the emitter terminal in response to the control signal being at the ON potential.

The cutoff circuit 120 is connected between the gate terminal of the power semiconductor element 110 and the reference potential. As one example, the cutoff circuit 120 is an FET controlled to be on or off between a drain element and a source terminal in response to the gate potential. The cutoff circuit 120, in which the drain element is connected to the gate terminal of the power semiconductor element 110 and the source terminal is connected to the reference potential, switches whether or not to supply the control signal input from the control terminal 102 to the gate terminal of the power semiconductor element 110.

In other words, the cutoff circuit 120, in which the drain element is connected to the gate terminal of the power semiconductor element 110 and the source terminal is connected to the emitter terminal of the power semiconductor element 110, electrically connects the gate terminal and the emitter terminal of the power semiconductor element 110 and switches whether or not to set the gate of the power semiconductor element 110 be at the OFF potential. As one example, the cutoff circuit 120 is a normally-off switch element electrically connecting between the drain element and the source terminal in response to the gate terminal of the high potential. In this case, it is desirable that the cutoff circuit 120 is a n channel type MOSFET.

The resistor 122 is connected between the control terminal 102 and the gate terminal of the power semiconductor element 110. If the cutoff circuit 120 is in an OFF state, the resistor 122 transmits the control signal to the gate terminal of the power semiconductor element 110. If the cutoff circuit 120 is in an ON state and causes the control signal to flow toward the reference potential, the resistor 122 decreases the voltage of the control signal. That is, the reference potential is supplied to the gate terminal of the power semiconductor element 110.

The cutoff condition detection portion 130 detects whether a predetermined cutoff condition is met. The cutoff condition detection portion 130 determines that the cutoff condition is met if an abnormality occurs in the power semiconductor element 110. For example, the cutoff condition detection portion 130 determines that the cutoff condition is met in response to the power semiconductor element 110 heated to a temperature equal to or greater than the reference temperature.

As one example, the cutoff condition detection portion 130 has a temperature sensor to detect the temperature of the power semiconductor element 110, and outputs the high potential as a detection signal in response to the detected temperature that exceeds the reference temperature. The cutoff condition detection portion 130 supplies the detection signal to the latch portion 150. As one example, the cutoff condition detection portion 130 operates the control signal input from the control terminal 102 as a power source, and does not output the signal if the control signal is the low potential.

The reset portion 140 outputs a reset signal to instruct to reset during a predetermined period in response to an input of a control signal Vin that turns the power semiconductor element 110 on.

For example, the reset portion 140 outputs the reset signal in response to the control signal of the high potential. As one example, the reset portion 140 supplies a pulse signal with a predetermined pulse width to the latch portion 150 as the reset signal. As one example, the reset portion 140 operates the control signal input from the control terminal 102 as the power source, and does not output the signal if the control signal is the low potential.

The latch portion 150 is reset in response to the reset signal and latches that an occurrence of the cutoff condition is detected after the reset. That is, the latch portion 150 latches that the detection signal is received from the cutoff condition detection portion 130 after the period of reset during which the latch portion receives the reset signal and is reset is over. Also, the latch portion 150 generates and supplies the cutoff signal to the gate terminal of the cutoff circuit 120. The cutoff circuit 120 controls the gate of the power semiconductor element 110 to be at the OFF potential in response to the latching of occurrence of the cutoff condition by the latch portion 150. That is, the latch portion 150 cuts off the supply of the control signal from the control terminal 102 to the power semiconductor element 110 by outputting the cutoff signal.

As one example, the latch portion 150 generates the cutoff signal of the high potential from the low potential. Accordingly, the power semiconductor element 110 switches to the OFF state. As one example, the latch portion 150 keeps the control signal input from the control terminal 102 in a latched value as an operation power source, and does not output the signal if the control signal is the low potential. As one example, the latch portion 150 is a RS flip-flop.

In the semiconductor apparatus 100 according to the present embodiment described above, if the power semiconductor element 110 is in a normal state and the control signal is the high potential, the power semiconductor element 110 turns to the ON state. Accordingly, the collector current Ic flows from the power source 40 via the primary coil 32 of the ignition coil 30. It should be noted that a time change dIc/dt of the collector current Ic is defined by an inductance of the primary coil 32 and a supply voltage of the power source 40, and the collector current Ic is increased to a predetermined (or set) current value. For example, the collector current Ic is increased approximately to several A, a dozen of A or several tens of A.

Then, as the control signal is the low potential, the power semiconductor element 110 turns to the OFF state and the collector current is drastically decreased. By the drastic decrease of the collector current, a both-end voltage of the primary coil 32 is drastically increased according to its own induced electromotive force, generating the induced electromotive force approximately up to several tens of kV in the both-end voltage of the secondary coil 34. The ignition apparatus 1000 discharges the ignition plug 20 and ignites the combustible gas by supplying such a voltage of the secondary coil 34 to the ignition plug 20.

Here, if the high potential state of the control signal continues due to the malfunction of the control signal generation portion 10 and the like, the power semiconductor element 110 continues the ON state and causes the collector current Ic to keep flowing between the collector terminal and the emitter terminal. Accordingly, if the temperature of the power semiconductor element 110 increases and exceeds the reference temperature, the cutoff condition detection portion 130 detects the abnormality and supplies the detection signal to the latch portion 150. Since the latch portion 150 latches the detection signal and cuts off the supply of the control signal from the control terminal 102 to the power semiconductor element 110, the gate potential of the power semiconductor element 110 turns to the OFF potential and the collector current Ic is cutoff.

If the state where the power semiconductor element 110 causes the collector current Ic to flow continues, the power semiconductor element 110 and the ignition coil 30 are heated, and the malfunction and the like occur in some cases. In the ignition apparatus 1000 according to the present embodiment, since the cutoff circuit 120 cuts off the supply of the control signal to the power semiconductor element 110 and cuts off the collector current Ic even if the continuation of the control signal of the high potential resulting in such a malfunction and the like occurs, an occurrence of damages and malfunctioning and the like on the ignition apparatus 1000 and components of the automobile can be prevented.

Figure 2:
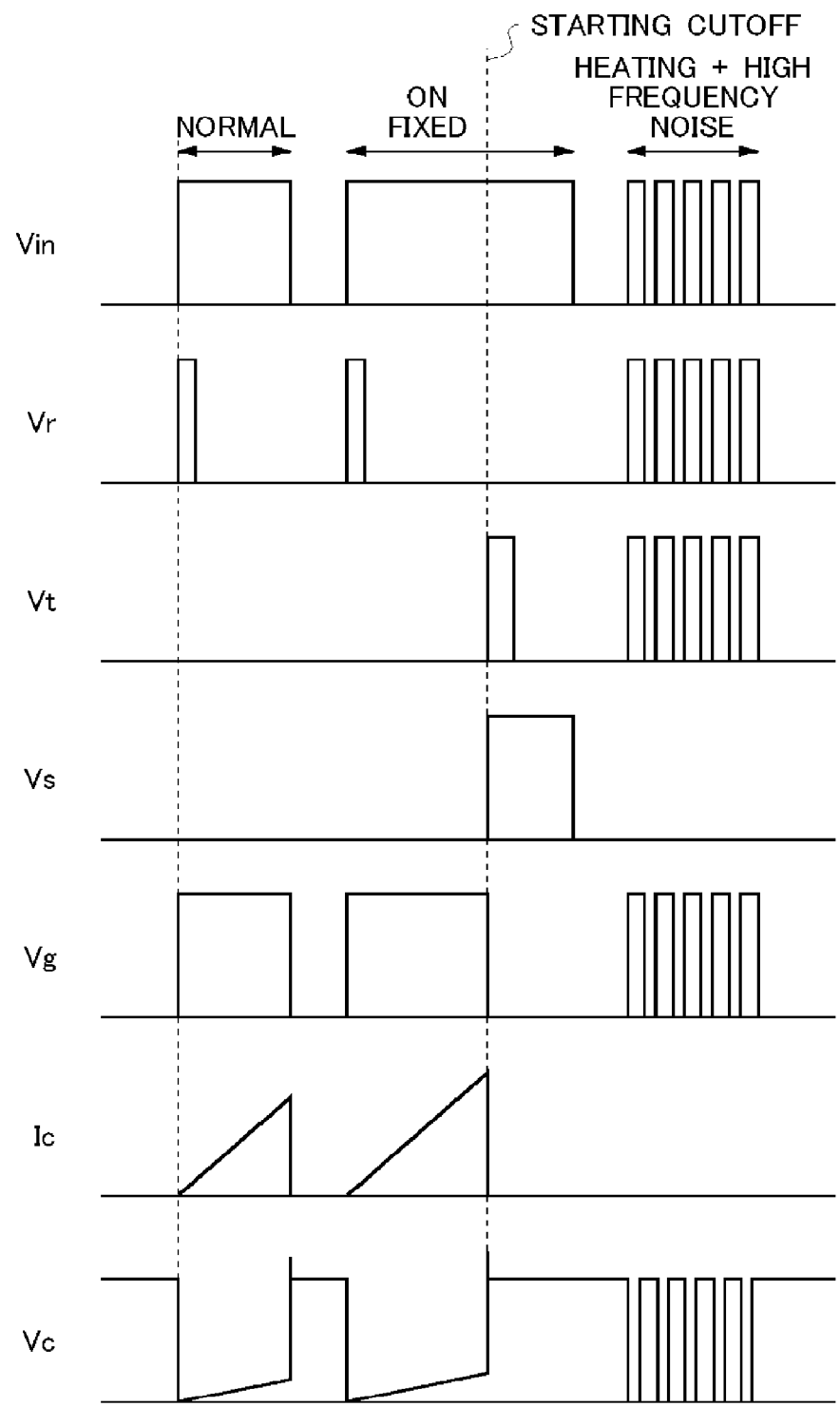
FIG. 2 shows examples of operation waveforms of each portion of a semiconductor apparatus 100 according to the present embodiment.

FIG. 2 shows an example of operation waveforms of each portion of the semiconductor apparatus 100 according to the present embodiment. In FIG. 2, the horizontal axis indicates time and the vertical axis indicates voltage values or current values. Also, FIG. 2 shows the respective time waveforms of a control signal input from the control terminal 102 referred to as "Vin", a reset signal output by the reset portion 140 referred to as "Vr", a detection signal output by the cutoff condition detection portion 130 referred to as "Vt", a cutoff signal output by the latch portion 150 referred to as "Vs", a potential of the gate terminal of the power semiconductor element 110 referred to as "Vg", a current between the collector and the emitter of the power semiconductor element 110 (as a collector current) referred to as "Ic", and a voltage between the collector and the emitter of the power semiconductor element 110 (as a collector voltage) referred to as "Vc".

If the control signal Vin to be input in the semiconductor apparatus 100 is the low potential (as one example, 0V), the reset signal Vr, the detection signal Vt, the cutoff signal Vs, and the gate potential Vg are the low potential (0V), the power semiconductor element 110 is in the OFF state, the collector current Ic is 0 A, and the collector voltage Vc becomes an output voltage of the power source 40 (as one example, 14V).

Then, once the control signal Vin turns to the high potential (as one example, 5V), the gate potential Vg turns to the high potential and the power semiconductor element 110 switches to the ON state, the collector current Ic starts to increase and the collector voltage Vc becomes approximately 0V first and then starts to increase. Also, the reset portion 140 outputs the reset signal Vr of the high potential and resets the latch portion 150.

Then, after the control signal Vin turns to the high potential, if the power semiconductor element 110 remains in the state where the temperature does not exceed the reference temperature and the control signal Vin returns to the low potential again, the low potential becomes the gate potential Vg of the power semiconductor element 110, the power semiconductor element 110 switches to the OFF state. Accordingly, the igniting operation described in FIG. 1 is executed, the collector current Ic is approximately 0 A, and the collector voltage Vc returns to the output potential of the power source. It should be noted that, as the igniting operation, the collector voltage Vc instantaneously turns to the high voltage first and then returns to the output potential of the power source. The above are the operations of the semiconductor apparatus 100 in a range shown as "normal" in the control signal Vin of FIG. 2.

Next, an example of a case will be described, where the state in which the control signal Vin turns to the high potential continues and the temperature of the power semiconductor element 110 exceeds the reference temperature. In this case, until the state where the control signal Vin turns to the high potential, as already described, the power semiconductor element 110 switches to the ON state, the collector current Ic starts to increase, and the collector voltage Vc becomes approximately 0V first and then starts to increase.

Here, if the high potential state of the control signal Vin continues, the increase of the collector current Ic continues and the temperature of the power semiconductor element 110 increases. Then, once the temperature of the power semiconductor element 110 exceeds the reference temperature, the cutoff condition detection portion 130 detects the abnormality of the power semiconductor element 110 and starts the cutoff operation. A point of time shown as "starting cutoff" by a dashed line in FIG. 2 is an example of the point of time when the semiconductor apparatus 100 starts the cutoff operation.

The cutoff condition detection portion 130 outputs the detection signal Vt of the high potential. The latch portion 150 latches the detection signal Vt, outputs the cutoff signal Vs of the high potential and causes the gate potential Vg to be the low potential. Accordingly, the power semiconductor element 110 switches to the OFF state, the igniting operation described in FIG. 1 is executed, the collector current Ic becomes approximately 0 A, and the collector voltage Vc returns to the output voltage of the power source.

Once the collector current Ic and the collector voltage Vc return to the originals first and then the control signal Vin turns to the low potential, since the power supply to the latch portion 150 is cutoff, the cutoff signal Vs turns to the low potential. The above are the operations of the semiconductor apparatus 100 in a range shown as "ON fixed" in the control signal Vin of FIG. 2. As the above, even if an abnormal increase of the temperature occurs in the power semiconductor element 110, the semiconductor apparatus 100 according to the present embodiment can detect the abnormal state and switch the power semiconductor element 110 to the OFF state.

Here, the semiconductor apparatus 100 shown in FIG. 1 has described an example in which the latch portion 150 including the RS flip-flop and the like is used. More accurately, such a latch portion 150 outputs the low potential during the period of reset when the reset signal of the high potential inputs. That is, the latch portion 150 cannot immediately output the high potential even if the set signal (detection signal) inputs during the period of reset, and outputs the high potential after the period of reset is over. Therefore, during the period of reset, even if the cutoff condition detection portion 130 detects the overheat of the power semiconductor element 110, the power semiconductor element 110 continues being in the ON state until the period of reset is over.

Since the operation in the "ON fixed" state described in FIG. 2 detects the continuation of the overheat of the power semiconductor element 110 after the period of reset is over and the reset signal turns to the OFF potential, the latch portion 150 can promptly output the cutoff signal in response to the latching of the detection signal. However, in a case where noises and the like are superimposed on the control signal Vin, the control signal Vin transiently turns to the high potential, and the reset signal is output, the power semiconductor element 110 is in the ON state from the beginning of the period of reset to the end of the period of reset.

For example, in a case where a high frequency noise and the like are superimposed on the control signal Vin, the control signal Vin repeats the transient high potential, and a plurality of reset signals are output in response to the high potential, the power semiconductor element 110 becomes to be in the ON state during the plurality of periods of reset. In this case, since the power semiconductor element 110 intermittently becomes to be in the ON state and causes the current to flow, the power semiconductor element 110, devices in the periphery, and the like are heated.

A period during which the plurality of periods of reset occur due to the high frequency noise and the heating of the power semiconductor element 110 continues is shown as "heating+high frequency noise" in FIG. 2. A overheat state where the temperature is equal to or greater than the reference temperature occurs sometimes if the power semiconductor element 110 and the like continue to be heated in this way; however, even if the overheat is detected and the detection signal is supplied to the latch portion 150, the latch portion 150 cannot output the cutoff signal. Therefore, such a overheat state further continues and the malfunctions of the power semiconductor element 110 and the like occur in some cases. Here, the semiconductor apparatus 200 according to the present embodiment controls the power semiconductor element 110 to be in the OFF state during the period of reset of the latch portion 150 and prevents the power semiconductor element 110 from being heated even if the high frequency noise is superimposed on the control signal Vin.

Figure 3:
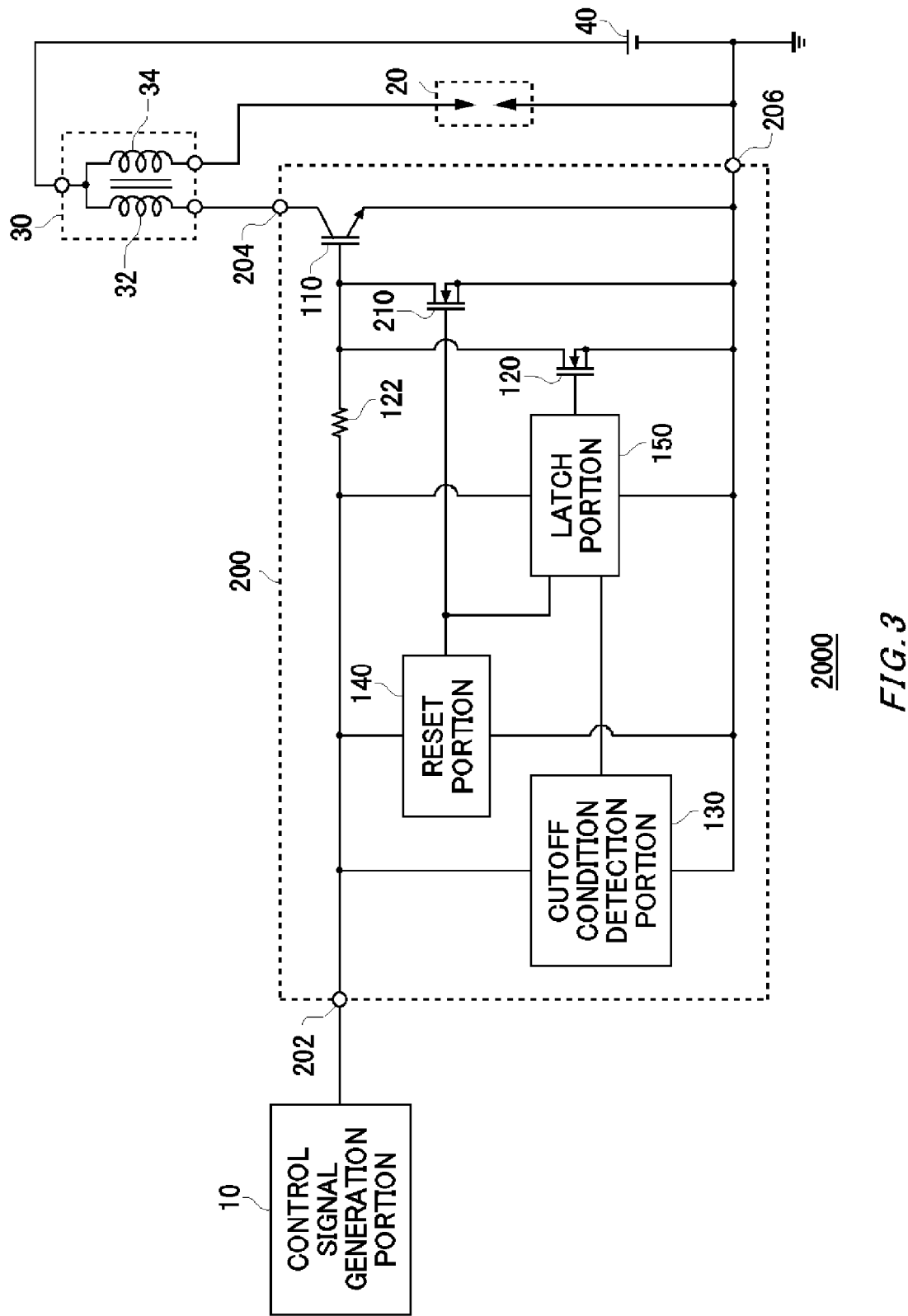
FIG. 3 shows a configuration example of an ignition apparatus 2000 according to the present embodiment.

FIG. 3 shows a configuration example of the ignition apparatus 2000 according to the present embodiment. In the ignition apparatus 2000 shown in FIG. 3, the same reference signs are given to approximately the same operations as those of the ignition apparatus 1000 according to the present embodiment shown in FIG. 1, and the descriptions are omitted. The ignition apparatus 2000 includes the semiconductor apparatus 200. It should be noted that the descriptions about the control signal generation portion 10, the ignition plug 20, the ignition coil 30 and the power source 40 that the ignition apparatus 2000 includes are omitted.

The semiconductor apparatus 200 includes a control terminal 202, a first terminal 204, a second terminal 206, a power semiconductor element 110, a cutoff circuit 120, a resistor 122, a cutoff condition detection portion 130, a reset portion 140, a latch portion 150, and a prevention circuit 210. The control terminal 202 inputs a control signal to control the power semiconductor element 110. The control terminal 202 is connected to the control signal generation portion 10 and receives the control signal. The first terminal 204 is connected to the power source 40 via the ignition coil 30. The second terminal 206 is connected to the reference potential. That is, the first terminal 204 is a terminal on the high potential side compared with the second terminal 206, and the second terminal 206 is a terminal on the low potential side compared with the first terminal 204.

It should be noted that since the power semiconductor element 110, the cutoff circuit 120, the resistor 122, the cutoff condition detection portion 130, and the latch portion 150 have been described in FIG. 1, the descriptions are omitted here. Also, the reset portion 140 supplies the reset signal to the prevention circuit 210 in response to the input of the control signal Vin, in addition to the operations described in FIG. 1.

The prevention circuit 210 prevents the gate of the power semiconductor element 110 from being at the ON potential during the period of reset of the latch portion 150 even if the cutoff condition is met. For example, the prevention circuit 210 controls the gate of the power semiconductor element 110 to be at the OFF potential during a period when the reset portion 140 outputs the reset signal. As one example, the prevention circuit 210 electrically connects the gate terminal and the emitter terminal of the power semiconductor element 110 respectively and causes the gate terminal of the power semiconductor element 110 to be at the OFF potential in response to the reset signal of the high potential.

As one example, the prevention circuit 210 has a normally-off switch element to electrically connect between the drain element and the source terminal in response to the gate terminal of the high potential. In this case, it is desirable that the prevention circuit 210 is a n channel type MOSFET. That is, it is desirable that the prevention circuit 210 is the same type of switch element as the cutoff circuit 120.

In the semiconductor apparatus 200 according to the present embodiment described above, similar to the semiconductor apparatus 100 described in FIG. 1, if the power semiconductor element 110 is in a normal state and the control signal of the high potential, the power semiconductor element 110 becomes to be in the ON state. Accordingly, as described in FIG. 1, the ignition apparatus 2000 can discharges the ignition plug 20 to ignite the combustible gas.

Also, if the abnormality such as overheat and the like occurs in the power semiconductor element 110, as described in FIG. 1, the cutoff condition detection portion 130 detects the overheat and supplies the detection signal to the latch portion 150. Accordingly, the latch portion 150 causes the gate potential of the power semiconductor element 110 to be at the OFF potential and cuts off the collector current Ic. Also, during the period of reset of the latch portion 150, since the prevention circuit 210 causes the gate terminal of the power semiconductor element 110 to be at the OFF potential, the semiconductor apparatus 200 can prevent the malfunction which switches the power semiconductor element 110 to the ON state even if the noise and the like are superimposed on the control signal Vin. Details for each portion of such an ignition apparatus 2000 will be described in the followings.

Figure 4:
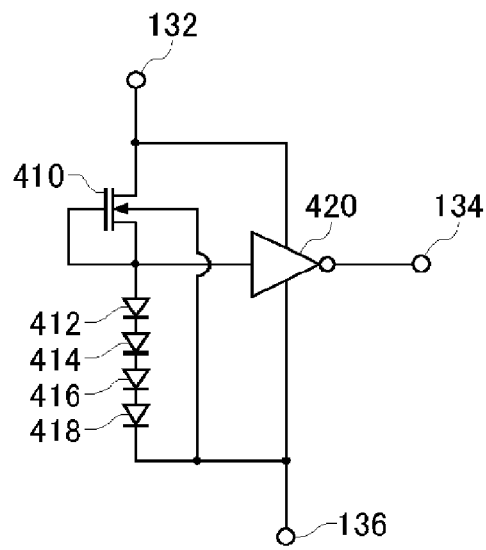
FIG. 4 shows a configuration example of a cutoff condition detection portion 130 according to the present embodiment.

FIG. 4 shows a configuration example of the cutoff condition detection portion 130 according to the present embodiment. The cutoff condition detection portion 130 has a control signal input portion 132, a detection signal output portion 134, a reference potential input portion 136, a FET 410, a diode 412, a diode 414, a diode 416, a diode 418, and an inverter 420.

The control signal input portion 132 inputs the control signal that is input from the control terminal 202. The cutoff condition detection portion 130 operates the control signal as the power source. The detection signal output portion 134 outputs the detection result of the cutoff condition detection portion 130. As one example, the detection signal output portion 134 is connected to the latch portion 150 and outputs the high potential as the detection result of overheat. The reference potential input portion 136 is connected to the reference potential.

The FET 410 becomes to be in the ON state in response to the input of the control signal from the control signal input portion 132. The FET 410, in which a drain element is connected to the control signal input portion 132 and a gate terminal and a source terminal are connected, operates as a resistor with an approximately constant resistance value in response to the high potential of the control signal. As one example, the FET 410 is a normally-on depletion type MOSFET.

The four diodes, i. e., the diode 412, the diode 414, the diode 416, and the diode 418, are connected in series between the FET 410 and the reference potential input portion 136. The four diodes are connected to an anode terminal on the FET 410 side and to a cathode terminal on the reference potential input portion 136 side. Here, a threshold voltage in a case where a forward current flows through the diode tends to decrease along with the increase of the temperature, the diode can operate as a temperature sensor using such a characteristic.

For example, the position of the diode is provided close to the power semiconductor element 110 such that the temperature of the diode also varies along with the temperature change of the power semiconductor element 110. Then, if the temperature of the power semiconductor element 110 is in a normal range, a total value of the threshold voltages of the diodes connected in series is regulated so as to be greater than the high potential of the control signal. Also, if the temperature of the power semiconductor element 110 is equal to or greater than the reference, the total value of the threshold voltages of the diodes connected in series is regulated so as to be less than the high potential of the control signal. The regulation can be executed by increasing or decreasing the number of the diodes and/or connecting the resistors in series and the like.

The example of FIG. 4 shows an example where four diodes are connected in series and are regulated such that the forward current flows in response to the temperature of the power semiconductor element 110 equal to or greater than the reference temperature. Accordingly, the source terminal of the FET 410 changes into the high potential if the temperature of the power semiconductor element 110 is in a normal range, and turns to the low potential if the temperature of the power semiconductor element 110 is equal to or greater than the reference. It should be noted that the number of the diodes is one example and may be changed in response to the control signal, the reference temperature and the like.

The inverter 420 inverts the potential of the source terminal of the FET 410 and outputs the result. For example, the inverter 420 outputs the low potential if the temperature of the power semiconductor element 110 is in a normal range, or outputs the high potential if the temperature of the power semiconductor element 110 is equal to or greater than the reference. That is, the inverter 420 causes the output corresponding to the temperature of the power semiconductor element 110 to be output from the detection signal output portion 134 as the detection signal.

As the above, the cutoff condition detection portion 130 includes one or more diodes as temperature sensors to detect the temperature of the power semiconductor element 110, and outputs the high potential as the detection signal in response to the detected temperature that exceeds the reference temperature. It should be noted that using one or more diodes as the temperature sensors is one example, and a temperature measurement resistor using a thermistor, platinum and the like or a thermocouple and the like may be used, instead of this.

Figure 5:
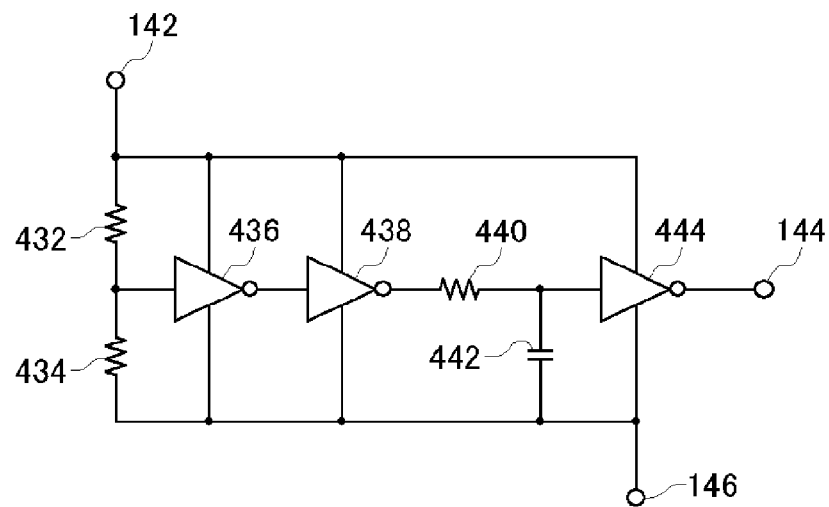
FIG. 5 shows a configuration example of a reset portion 140 according to the present embodiment.

FIG. 5 shows a configuration example of the reset portion 140 according to the present embodiment. The reset portion 140 includes a control signal input portion 142, a reset signal output portion 144, a reference potential input portion 146, a resistor 432, a resistor 434, an inverter 436, an inverter 438, a resistor 440, a capacitor 442, and an inverter 444.

In the control signal input portion 142, a control signal input from the control terminal 202 is input. The reset signal output portion 144 outputs a reset signal generated by the reset portion 140. The reference potential input portion 146 is connected to the reference potential.

The resistor 432 and the resistor 434 are connected in series between the control signal input portion 142 and the reference potential input portion 146, and divide voltages of the control signal Vin input from the control signal input portion 142. Given that the resistance value of the resistor 432 is R1 and the resistance value of the resistor 434 is R2, the voltage-divided potential is Vin*R2/(R1+R2). As one example, if the control signal transiently, linearly rises from the OFF potential (as one example, 0V) to the ON potential (as one example, 5V), the voltage-divided potential also linearly rises from 0V to 5*R2/(R1+R2).

The inverter 436 is connected between the resistor 432 and the resistor 434, receives and inverts the voltage-divided potential, and outputs the result. The inverter 438 receives and inverts the output of the inverter 436, and outputs the result. The resistor 440 and the capacitor 442 configure a RC circuit to receive the output of the inverter 438, have a delay of a time constant RC, and output the rose signal. The inverter 444 receives and inverts the output of the resistor 440 and the capacitor 442, and outputs the result.

It should be noted that the inverter 436, the inverter 438, and the inverter 444 respectively use the control signal that is input from the control signal input portion 142 as the operation power source. Therefore, each inverter outputs the signal being at approximately the same potential as the control signal in a process where the control signal transiently rises until the control signal reaches the threshold value of the inverters. It should be noted that in the present example, the threshold value of each inverter is set to approximately the same value V1. Operations in each portion of such a reset portion 140 will be described by using FIG. 6.

Figure 6:
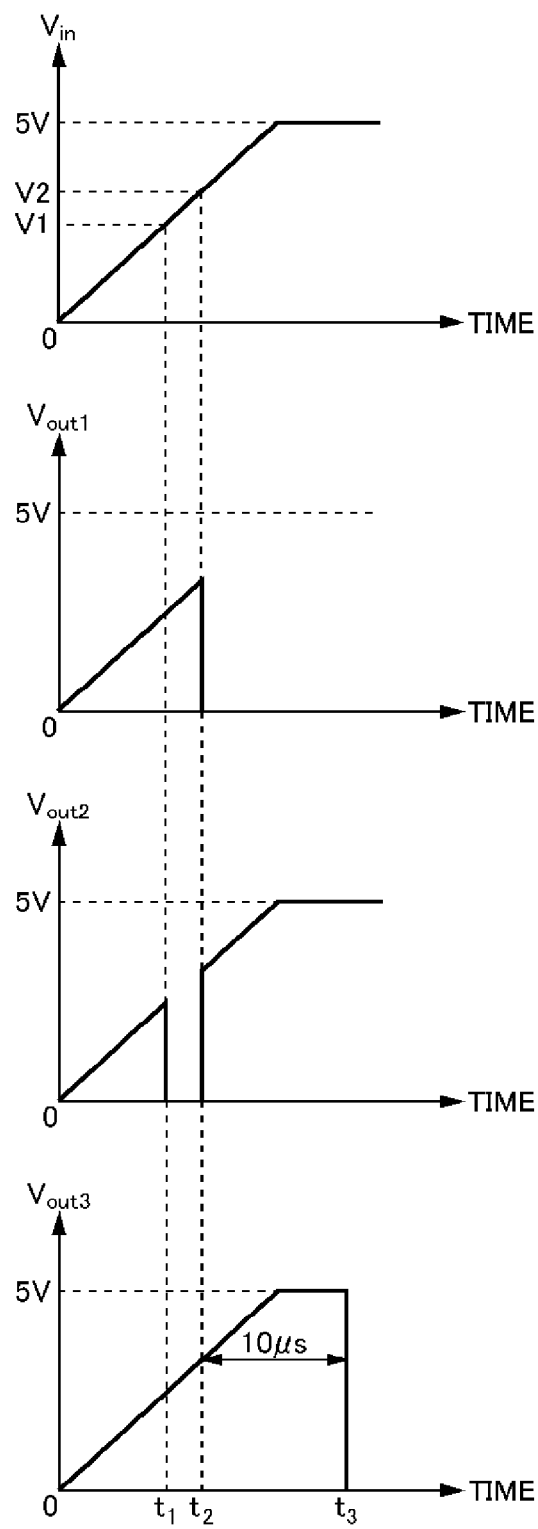
FIG. 6 shows one example of operation waveforms of each portion of the reset portion 140 according to the present embodiment.

FIG. 6 shows one example of the operation waveforms of each portion of the reset portion 140 according to the present embodiment. In FIG. 6, the horizontal axis indicates time and the vertical axis indicates output potentials. FIG. 6 shows one example of the output potentials of the inverter 436, the inverter 438 and the inverter 444 relative to a case where the control signal Vin that is input in the control signal input portion 142 linearly rises from the OFF potential (0V) to the ON potential (5V). The output potentials Vout 1, Vout 2 and Vout 3 of the inverter 436, the inverter 438, and the inverter 444 become approximately of the same potential as the power source potential (i. e., the control signal Vin) until the input potential reaches the threshold value of the inverters.

Even if the potential of the power source exceeds the threshold value V1, since the voltage-divided potential Vin*R2/(R1+R2) to be input is a value equal to or less than the threshold value V1, the inverter 436 inverts the input potential which is the low potential to be the high potential and outputs the high potential. It should be noted that although the inverter 436 operates to output the high potential, if the power source potential is a transient potential in a process of reaching the high potential (for example, 5V), the inverter 436 outputs the power source potential as the high potential. FIG. 6 shows an example where the output potential Vout 1 of the inverter 436 outputs approximately the same potential as the power source potential Vin after the time t1.

The inverter 436 inverts the low potential and outputs the result, in response to the potential of the power source that exceeds the threshold value V1 and the input voltage-divided potential that exceeds the threshold value V1 (i.e., the input of the high potential). FIG. 6 shows an example where the output potential Vout 1 of the inverter 436 changes into the low potential (0V) at time t2.

The inverter 438 inverts the low potential and outputs the result, in response to the potential of the power source that exceeds the threshold value V1 and the input potential being the potential that exceeds the threshold value V1. FIG. 6 shows an example where the output potential Vout 2 of the inverter 438 changes into the low potential at time t1. The inverter 438 inverts the high potential and outputs the result, in response to the potential of the power source that exceeds the threshold value V1 and the input potential being the low potential. It should be noted that the inverter 438 outputs the power source potential as the high potential if the power source potential is a transient potential in a process of reaching the high potential. FIG. 6 shows an example where the output potential Vout 2 of the inverter 438 changes into approximately the same potential as the power source potential Vin after the time t2.

The RC circuit according to the resistor 440 and the capacitor 442 delays the output signal of the inverter 438. FIG. 6 shows an example where the RC circuit delays the output signal by 10 μs. The inverter 444 inverts the low potential and outputs the result, in response to the potential of the power source that exceeds the threshold value V1 and the input potential being the potential that exceeds the threshold value V1. FIG. 6 shows an example where the output potential Vout 3 of the inverter 444 changes into the low potential at time t3.

As the above, the reset portion 140 according to the present embodiment outputs the reset signal after the ON potential is input in the control signal input portion 142 and the reference time t2 is over. As one example, the reset signal shown in FIG. 6 is a pulse signal using the time constant set with the resistor 440 and the capacitor 442 as the pulse width.

Figure 7:
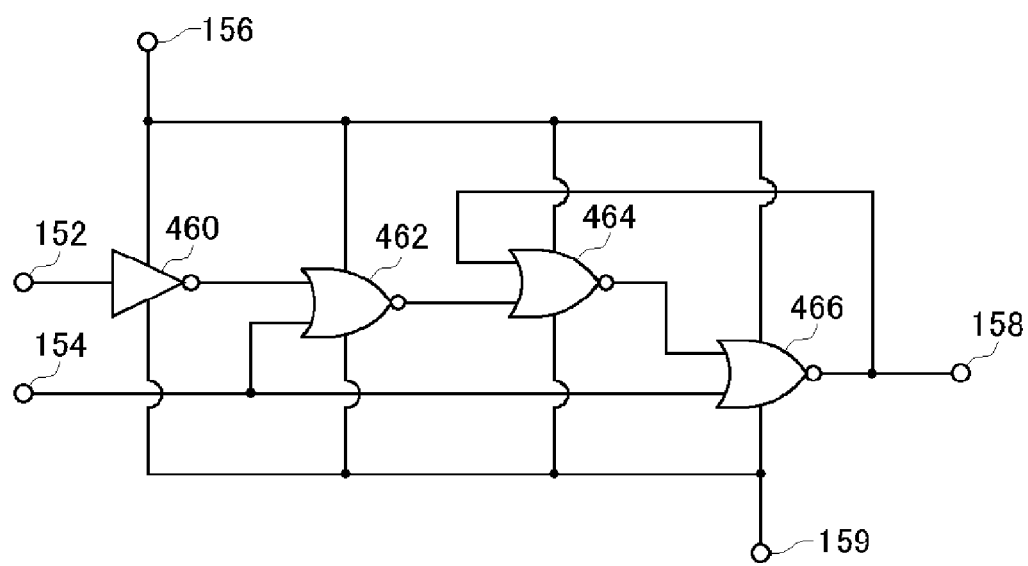
FIG. 7 shows a configuration example of a latch portion 150 according to the present embodiment.

FIG. 7 shows a configuration example of the latch portion 150 according to the present embodiment. The latch portion 150 includes a set signal input portion 152, a reset signal input portion 154, a control signal input portion 156, a cutoff signal output portion 158, a reference potential input portion 159, and inverter 460, a first NOR circuit 462, a second NOR circuit 464, and a third NOR circuit 466.

The set signal input portion 152 is connected to the detection signal output portion 134 of the cutoff condition detection portion 130, and the detection signal of overheat is input in the set signal input portion 152. The reset signal input portion 154 is connected to the reset signal output portion 144 of the reset portion 140, and the reset signal is input in the reset signal input portion 154. In the control signal input portion 156, the control signal is input which is input from the control terminal 202. The cutoff signal output portion 158 outputs the cutoff signal generated by the latch portion 150. The reference potential input portion 159 is connected to the reference potential.

The inverter 460, the first NOR circuit 462, the second NOR circuit 464, and the third NOR circuit 466 respectively use the control signal input from the control terminal 202 as the operation power source. Therefore, under the condition that the control signal changes into the high potential, the latch portion 150 outputs the cutoff signal corresponding to the detection of the cutoff condition. Operations of the latch portion 150 in a case where the control signal changes into the high potential will be described in the followings.

The inverter 460 inverts the logic of the detection signal and outputs the result to the first NOR circuit 462. That is, the inverter 460 outputs the low potential if the detection signal of the cutoff condition detection portion 130 is the high potential. That is, the inverter 460 outputs the high potential if the abnormality such as overheat and the like in the power semiconductor element 110 is not detected, and outputs the low potential in response to a detection of the abnormality.

The first NOR circuit 462 respectively receives the output of the inverter 460 and the reset signal of the reset portion 140, and outputs the NOR operation result. That is, the first NOR circuit 462 outputs the high potential in a case where the abnormality is detected in the power semiconductor element 110 and no reset signal is input.

The second NOR circuit 464 receives the outputs of the first NOR circuit 462 and the latch portion 150, and outputs the NOR operation result. Also, the third NOR circuit 466 receives the output of the second NOR circuit 464 and the reset signal, and outputs the NOR operation result. The second NOR circuit 464 and the third NOR circuit 466 configure a RS flip-flop. That is, after the reset signal is input in the third NOR circuit 466, the second NOR circuit 464 and the third NOR circuit 466 latches, as the set signal, the high potential corresponding to the detection of the abnormality of the power semiconductor element 110, the high potential being input in the second NOR circuit 464.

As the above, the latch portion 150 according to the present embodiment latches the detection signal of overheat of the power semiconductor element 110 under the condition that the control signal changes into the high potential. Also, the latch portion 150 supplies the cutoff signal to the cutoff circuit 120. The cutoff circuit 120 causes the gate potential of the power semiconductor element 110 to be at the OFF potential in response to the latching of the met cutoff condition by the latch portion 150.

As the above, the semiconductor apparatus 200 according to the present embodiment operates as an igniter which controls the current flowing through the ignition coil 30 while limiting operations in response to overheat of the power semiconductor element 110 in accordance with the control signal from outside. The operations of the semiconductor apparatus 200 will be described using FIG. 8.

Figure 8:
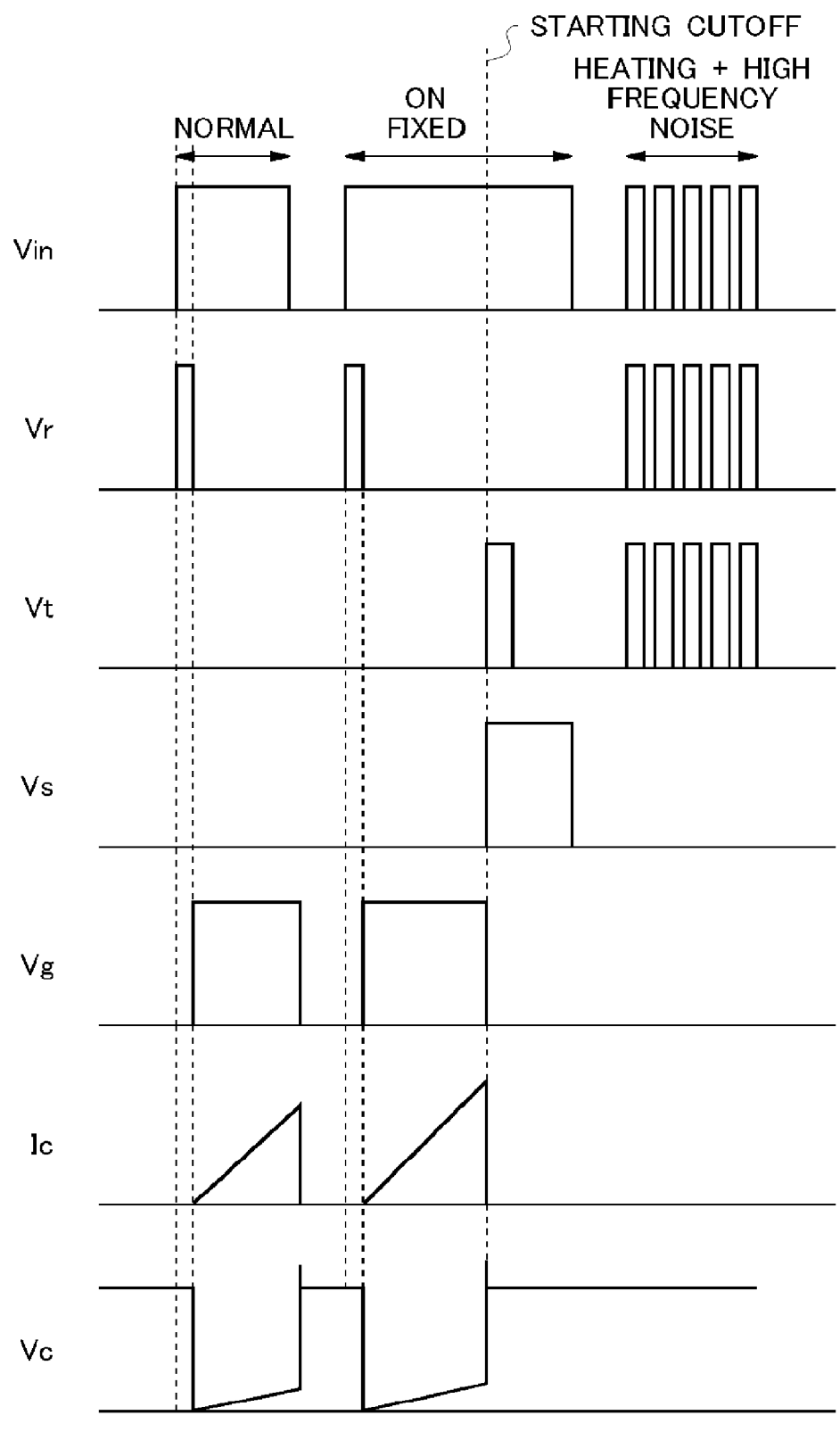
FIG. 8 shows an example of operation waveforms of each portion of the semiconductor apparatus 200 according to the present embodiment.

FIG. 8 shows an example of operation waveforms of each portion of the semiconductor apparatus 200 according to the present embodiment. In FIG. 8, the horizontal axis indicates time and the vertical axis indicates voltage values or current values. Also, FIG. 8 shows the respective time waveforms of a control signal that is input from the control terminal 102 referred to as "Vin", a reset signal output by the reset portion 140 referred to as "Vr", a detection signal output by the cutoff condition detection portion 130 referred to as "Vt", a cutoff signal output by the latch portion 150 referred to as "Vs", a potential of the gate terminal of the power semiconductor element 110 referred to as "Vg", a current between the collector and the emitter of the power semiconductor element 110 (as a collector current) referred to as "Ic", and a voltage between the collector and the emitter of the power semiconductor element 110 (as a collector voltage) referred to as "Vc".

If the control signal Vin to be input in the semiconductor apparatus 200 is the low potential (as one example, 0V), similar to FIG. 2, the reset signal Vr, the detection signal Vt, the cutoff signal Vs, and the gate potential Vg are the low potential (0V), the power semiconductor element 110 is in the OFF state, the collector current Ic is 0 A, and the collector voltage Vc becomes the output voltage of the power source 40 (as one example, 14V).

Then, once the control signal Vin changes into the high potential (as one example, 5V), the reset portion 140 outputs the reset signal Vr of the high potential and resets the latch portion 150. Also, the reset portion 140 supplies the reset signal Vr to the prevention circuit 210. The prevention circuit 210 causes the gate potential Vg of the power semiconductor element 110 to be the low potential during the period of reset when the reset signal Vr changes into the high potential. Accordingly, during the period of reset, the collector current Ic is 0 A, and the collector voltage Vc continues being the output voltage of the power source 40.

Then, once the period of reset is over and the reset signal changes into the low potential, the prevention circuit 210 causes the gate potential Vg of the power semiconductor element 110 to be of the high potential and switches the power semiconductor element 110 to the ON state, the collector current Ic starts to increase, and the collector voltage Vc becomes approximately 0V first and then starts to increase.

Then, after the control signal Vin changes into the high potential, once the power semiconductor element 110 stays in the state where its temperature does not exceed the reference temperature and the control signal Vin changes into the low potential again, since the low potential becomes the gate potential Vg of the power semiconductor element 110, the power semiconductor element 110 switches to the OFF state. Accordingly, the igniting operation described in FIG. 1 is performed, the collector current Ic is approximately 0 A, and the collector voltage Vc returns to the output potential of the power source. It should be noted that the collector voltage Vc instantaneously becomes the high voltage first and then returns to the output potential of the power source, as the igniting operation. The above describes the operations of the semiconductor apparatus 200 in a range shown "normal" in the control signal Vin of FIG. 8.

Next, an example of a case will be described where the high potential state of the control signal Vin continues and the temperature of the power semiconductor element 110 exceeds the reference temperature. In this case, until the state where the control signal Vin changes into the high potential, as already described, the power semiconductor element 110 switches to the ON state, the collector current Ic starts to increase, and the collector voltage Vc becomes approximately 0V first and then starts to increase.

Here, if the high potential state of the control signal Vin continues, the increase of the collector current Ic continues and the temperature of the power semiconductor element 110 increases. Then, once the temperature of the power semiconductor element 110 exceeds the reference temperature, the cutoff condition detection portion 130 detects the abnormality of the power semiconductor element 110 and starts the cutoff operation. A point of time shown as "starting cutoff" by a dashed line in FIG. 8 is an example of the point of time when the semiconductor apparatus 200 starts the cutoff operation.

The cutoff condition detection portion 130 outputs the detection signal Vt of the high potential. The latch portion 150 latches the detection signal Vt, outputs the cutoff signal Vs of the high potential, and causes the gate potential Vg to be the low potential. Accordingly, the power semiconductor element 110 switches to the OFF state, the igniting operation described in FIG. 1 is performed, the collector current Ic becomes approximately 0 A, and the collector voltage Vc returns to the output voltage of the power source.

Once the collector current Ic and the collector voltage Vc return to the original ones first and then the control signal Vin changes into the low potential, since the power supply to the latch portion 150 is cutoff, the cutoff signal Vs changes into the low potential. The above describes the operations of the semiconductor apparatus 200 in a range shown as "ON fixed" in the control signal Vin of FIG. 8. As the above, even if the abnormal temperature increase occurs in the power semiconductor element 110, the semiconductor apparatus 200 according to the present embodiment can detect the abnormal state and switch the power semiconductor element 110 to the OFF state.

Also, since the semiconductor apparatus 200 causes the power semiconductor element 110 to be in the OFF state during the period of reset when the reset portion 140 outputs the reset signal, the semiconductor apparatus 200 can cause the power semiconductor element 110 to be kept in the OFF state even if the high frequency noise and the like are superimposed on the control signal Vin, transiently changing into the high potential. Therefore, the semiconductor apparatus 200 can keep the power semiconductor element 110 in the OFF state even if the plurality of periods of reset occur due to the high frequency noise. An example of a period during which the plurality of periods of reset occur due to the high frequency noise is shown as "heating+high frequency noise" in FIG. 8.

The prevention circuit 210 according to the present embodiment described above is an example in which a normally-off switch element is included and the power semiconductor element 110 is set in the OFF state during the period of reset. Instead of this, the prevention circuit 210 may have a logic sum circuit. A semiconductor apparatus 300 including such a prevention circuit 210 will be described in the followings.

Figure 9:
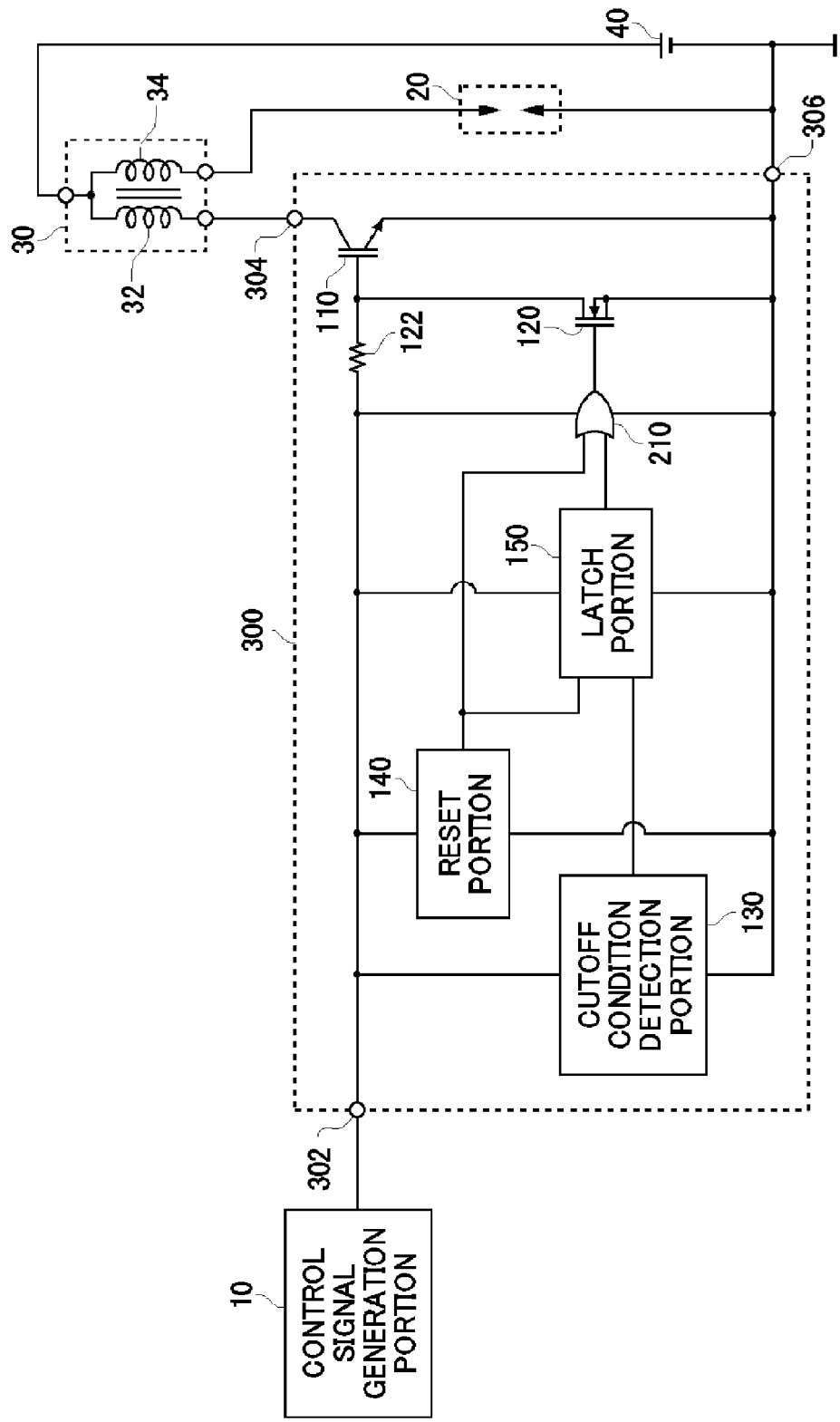
FIG. 9 shows a configuration example of an ignition apparatus 3000 according to the present embodiment.

FIG. 9 shows a configuration example of the ignition apparatus 3000 according to the present embodiment. In the ignition apparatus 3000 shown in FIG. 9, the same reference signs are given to approximately the same operations as those of the ignition apparatus 2000 according to the present embodiment shown in FIG. 3, and the descriptions are omitted. The ignition apparatus 3000 includes the semiconductor apparatus 300. It should be noted that the descriptions about the control signal generation portion 10, the ignition plug 20, the ignition coil 30, and the power source 40 that the ignition apparatus 3000 includes are omitted.

The semiconductor apparatus 300 includes a control terminal 302, a first terminal 304, a second terminal 306, a power semiconductor element 110, a cutoff circuit 120, a resistor 122, a cutoff condition detection portion 130, a reset portion 140, a latch portion 150, and a prevention circuit 210. The control terminal 302 inputs a control signal to control the power semiconductor element 110. The control terminal 302 is connected to the control signal generation portion 10 and receives the control signal. The first terminal 304 is connected to the power source 40 via the ignition coil 30. The second terminal 306 is connected to the reference potential. That is, the first terminal 304 is a terminal on the high potential side compared with the second terminal 306, and the second terminal 306 is a terminal on the low potential side compared with the first terminal 304.

It should be noted that since the power semiconductor element 110, the cutoff circuit 120, the resistor 122, the cutoff condition detection portion 130, and the latch portion 150 have been described in FIG. 1, the descriptions are omitted here. Also, the reset portion 140 supplies the reset signal to the prevention circuit 210 in response to the input of the control signal Vin, in addition to the operations described in FIG. 1. Also, instead of the cutoff circuit 120, the latch portion 150 supplies the cutoff signal to the prevention circuit 210.

The prevention circuit 210 controls the gate of the power semiconductor element 110 to be at the OFF potential during a period when the cutoff condition detection portion 130 detects the occurrence of the cutoff condition. Also, the prevention circuit 210 controls the gate of the power semiconductor element 110 to be at the OFF potential during a period when the reset portion 140 outputs the reset signal. The prevention circuit 210 has a logic sum circuit, operates the logic sum of the reset signal and the cutoff signal, and supplies the operated logic sum to the cutoff circuit 120.

That is, the prevention circuit 210 controls the gate of the power semiconductor element 110 to be at the OFF potential in response to the logic sum of the cutoff signal and the reset signal, the cutoff signal being output from the latch portion 150 and instructing to control the gate of the power semiconductor element 110 to be at the OFF potential. In this way, since the prevention circuit 210 according to the present embodiment controls the gate of the power semiconductor element 110 to be at the OFF potential also during the period of reset, the prevention circuit 210 can prevent the gate of the power semiconductor element 110 from changing into the ON potential during the period of reset even if the cutoff condition is met. Therefore, the semiconductor apparatus 300 can keep the power semiconductor element 110 in the OFF state even if the plurality of periods of reset occur due to the high frequency noise.

Figure 10:
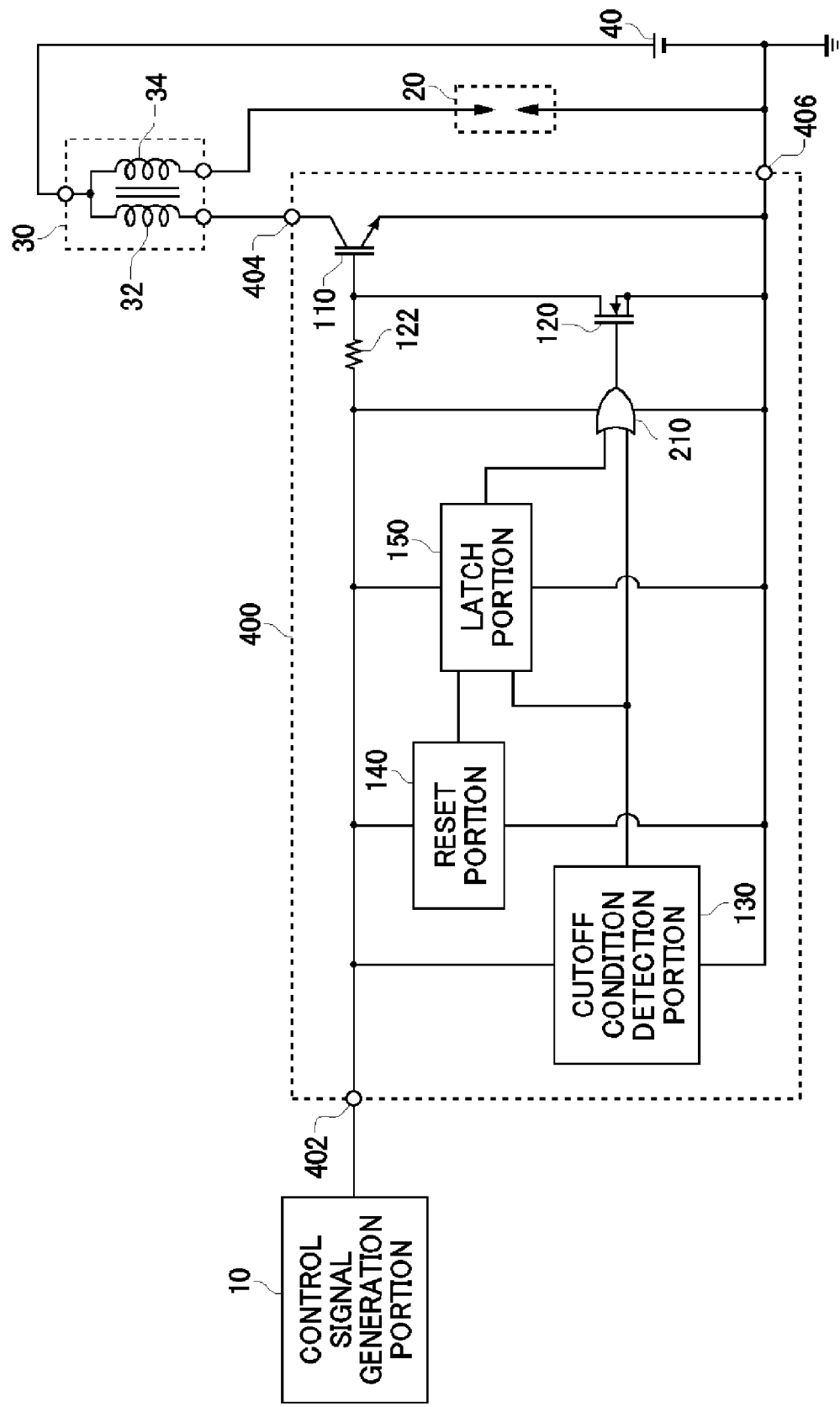
FIG. 10 shows a configuration example of an ignition apparatus 4000 according to the present embodiment.

FIG. 10 shows a configuration example of the ignition apparatus 4000 according to the present embodiment. In the ignition apparatus 4000 shown in FIG. 10, the same reference signs are given to approximately the same operations as those of the ignition apparatus 2000 and of the ignition apparatus 3000 according to the present embodiment shown in FIG. 3 and FIG. 9, and the descriptions are omitted. The ignition apparatus 4000 includes a semiconductor apparatus 400. It should be noted that the descriptions about the control signal generation portion 10, the ignition plug 20, the ignition coil 30, and the power source 40 that the ignition apparatus 4000 includes are omitted.

The semiconductor apparatus 400 includes a control terminal 402, a first terminal 404, a second terminal 406, the power semiconductor element 110, the cutoff circuit 120, the resistor 122, the cutoff condition detection portion 130, the reset portion 140, the latch portion 150, and the prevention circuit 210. The control terminal 402 inputs a control signal to control the power semiconductor element 110. The control terminal 402 is connected to the control signal generation portion 10 and receives the control signal. The first terminal 404 is connected to the power source 40 via the ignition coil 30. The second terminal 406 is connected to the reference potential. That is, the first terminal 404 is a terminal on the high potential side compared with the second terminal 406, and the second terminal 406 is a terminal on the low potential side compared with the first terminal 404.

It should be noted that since the power semiconductor element 110, the cutoff circuit 120, the resistor 122, the cutoff condition detection portion 130, and the latch portion 150 have been described in FIG. 1, the descriptions are omitted here. Also, the cutoff condition detection portion 130 supplies the detection signal to the prevention circuit 210 in response to the detection of overheat, in addition to the operations described in FIG. 1. Also, instead of the cutoff circuit 120, the latch portion 150 supplies the cutoff signal to the prevention circuit 210.

The prevention circuit 210 controls the gate of the power semiconductor element 110 to be at the OFF potential during the period when the cutoff condition detection portion 130 detects the occurrence of the cutoff condition. Also, the prevention circuit 210 controls the gate of the power semiconductor element 110 to be at the OFF potential during the period when the latch portion 150 outputs the cutoff signal. The prevention circuit 210 has a logic sum circuit, operates the logic sum of the detection signal and the cutoff signal, and supplies the operated logic sum to the cutoff circuit 120.

That is, the prevention circuit 210 controls the gate of the power semiconductor element 110 to be at the OFF potential in response to the logic sum of the cutoff signal and the detection signal, the cutoff signal being output from the latch portion 150 and instructing to control the gate of the power semiconductor element 110 to be at the OFF potential, the detection signal being output by the cutoff condition detection portion 130 when detecting the occurrence of the cutoff condition. In this way, since the prevention circuit 210 according to the present embodiment controls the gate of the power semiconductor element 110 to be at the OFF potential also during the period of reset in response to the occurrence of the cutoff signal, the prevention circuit 210 can prevent the gate of the power semiconductor element 110 from being at the ON potential during the period of reset even if the cutoff condition is met. Therefore, the semiconductor apparatus 400 can keep the power semiconductor element 110 in the OFF state even if the plurality of periods of reset occur due to the high frequency noise.

The semiconductor apparatus 200 and the like according to the present embodiment described above is an example in which the switch elements such as the power semiconductor element 110 and the like operate as an n channel type. In a case of forming such a semiconductor apparatus 200 on a substrate, it is preferable to form the switch elements of the n channel type in approximately the same arrangement. For example, in a case of forming a vertical semiconductor switch on a substrate, a collector terminal is formed on one surface of the substrate and a gate terminal and an emitter terminal are formed on the other surface. As one example, the power semiconductor element 110 has the collector terminal on a first terminal side, the collector terminal provided on a first surface side of the substrate, the gate terminal provided on a second surface side of the substrate, and the emitter terminal on a second terminal side, the emitter terminal provided on the second surface side of the substrate.

In this case, the second surface side of the substrate is n conductivity type. Therefore, it is desirable that the cutoff circuit 120 and the prevention circuit 210 described in FIG. 3 are n channel type MOSFET formed on the second surface side of the substrate. For example, the cutoff circuit 120 and the prevention circuit 210 are provided with the gate terminal, the drain element, and the source terminal on the second surface side of the substrate, and the drain element is connected to the gate terminal of the power semiconductor element 110.

In this way, by forming the same type of transistor on the substrate, the power semiconductor element 110, the cutoff circuit 120, and the prevention circuit 210 can be formed. Therefore, at least parts of processes of forming the power semiconductor element 110, the cutoff circuit 120, and the prevention circuit 210 can be made in common, and the efficiency in the process of manufacturing the semiconductor apparatus 200 and the like can be increased.

Figure 11:
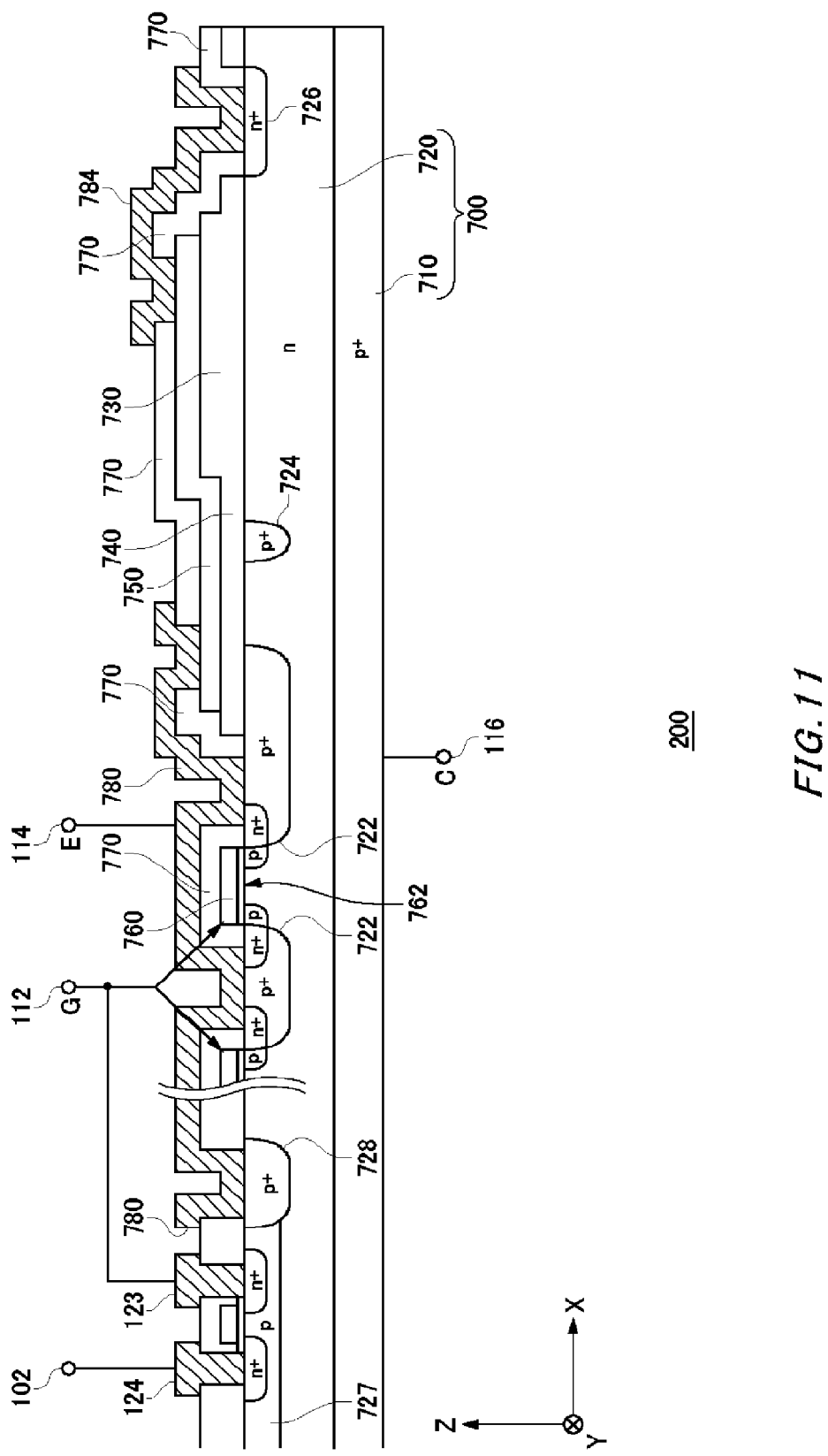
FIG. 11 shows a configuration example of one part of a substrate where the semiconductor apparatus 200 is formed, according to the present embodiment.

As the above, an example where the semiconductor apparatus 200 according to the present embodiment is formed on a substrate will be described using FIG. 11. FIG. 11 shows a configuration example of one part of the substrate where the semiconductor apparatus 200 according to the present embodiment is formed. FIG. 11 shows one example of a cross-section structure of the power semiconductor element 110 and the cutoff circuit 120 provided in the semiconductor apparatus 200. The power semiconductor element 110 has a collector terminal 116 provided on a first surface side of a substrate 700 and a gate terminal 112 and an emitter terminal 114 provided on a second surface side of the substrate 700. Also, the cutoff circuit 120 has a source electrode 123 and a drain electrode 124 on the second surface side of the substrate 700. The semiconductor apparatus 200 switches between an electrical connection and disconnection in a vertical direction (Z direction) between the emitter terminal 114 and the collector terminal 116 in response to the control signal input in the gate terminal 112.

The semiconductor apparatus 200 is formed on the substrate 700. The substrate 700 is provided with an n layer region 720 on a second surface side of a p+ layer region 710. As one example, the substrate 700 is a silicon substrate. For example, in the substrate 700, the n layer region 720 is formed by implanting impurities such as phosphorous or arsenic and the like into the second surface side of the p type substrate into which boron and the like are doped. FIG. 11 shows an example where a surface facing the −Z direction of the substrate 700 is set as a first surface and the first surface is set as a surface approximately parallel to an XY plane. Also, FIG. 11 shows a configuration example of a cross-section in an XZ plane approximately vertical to the first surface of the semiconductor apparatus 200. The collector terminal 116 is formed on the p+ layer region 710 side of the substrate 700. It should be noted that the collector electrode may be further formed on the first surface side of the substrate 700.

In the n layer region 720, a first well region 722, a second well region 724 a third well region 726, a fourth well region 727, and a fifth well region 728 are respectively formed. In the first well region 722, an emitter region of the power semiconductor element 110 is formed. A plurality of the first well regions 722 are formed in the n layer region 720. As one example, the first well region 722 is formed as the p+ conductivity type region, and the emitter region which is the n+ region is formed in the p+ region. The emitter terminal 114 is connected to the first well region 722 along with the emitter region. It should be noted that, as one example, a p region with an impurity concentration lower than that of the first well region 722 may be formed adjacent to the first well region 722.

The second well region 724 is formed on an end side of the substrate 700 than the first well region 722, electrically insulated from the first well region 722. For example, the second well region 724 is formed on the second surface side of the substrate 700 so as to surround the region where the first well region 722 is formed. As one example, the second well region 724 is formed in a ring shape. As one example, the second well region 724 is formed as the p+ conductivity region. The second well region 724 forms a depletion layer by a p-n junction with the n layer region 720 surrounding the periphery of the second well region 724 to prevent carriers caused by high voltages applied to the substrate 700 and the like from flowing through the first well region 722 side. The third well region 726 is formed in the outer periphery of the substrate 700 and is electrically connected to the collector terminal 116.

The fourth well region 727 is a region where transistor elements and the like other than the power semiconductor element 110 are formed. As one example, the fourth well region 727 is formed as the p+ conductivity region. In the p+ region, a source region and a drain region, which are the n+ regions configuring the n channel type MOSFET, are formed and operate as parts of the cutoff circuit 120. Also, the gate of the cutoff circuit 120 is formed between the source region and the drain region. The fifth well region 728 is formed so as to surround the fourth well region 727. As one example, the fifth well region 728 is formed as the p+ conductivity region. As one example, the fourth well region 727 may be formed with an impurity concentration lower than that of the fifth well region 728.

In a second surface of the n layer region 720, a first insulating film 730, a second insulating film 740, a semiconductor film 750, a gate electrode 760, a third insulating film 770, an emitter electrode 780, and an electrode portion 784 are stacked and formed. The first insulating film 730 and the second insulating film 740 are formed on the second surface side of the n layer region 720. The first insulating film 730 and the second insulating film 740 include oxide films, for example. As one example, the first insulating film 730 and the second insulating film 740 include silicon oxide. The second insulating film 740 is in contact with the first insulating film 730 and is formed thinner than the first insulating film 730.

The semiconductor film 750 is formed on an upper surface of the first insulating film 730 and the second insulating film 740, with one end connected to the emitter electrode 780 and the other end connected to the third well region 726. The semiconductor film 750 is formed of polysilicon, as one example. In the semiconductor film 750, a resistor and/or diode and the like may be formed. That is, the semiconductor film 750 is formed between the gate terminal 112 and the emitter terminal 114.

The gate electrode 760 is connected to the gate terminal 112. It should be noted that the gate insulated film 762 is formed between the gate electrode 760 and the n layer region 720. The third insulating film 770 electrically insulates the emitter electrode 780 and the electrode portion 784 which are stacked after the third insulating film 770 is formed. The third insulating film 770 is boron phosphorous silica glass (BPSG), as one example. Also, the third insulating film 770 exposes one part of the substrate 700 by etching and forms a contact hole.

The emitter electrode 780 is an electrode formed in contact with the first well region 722. As one example, the emitter electrode 780 is formed in the contact hole that the third insulating film 770 forms. As one example, in a case where a plurality of first well regions 722 are formed in the semiconductor apparatus 200, the emitter electrode 780 is formed in contact with the plurality of first well regions 722. Also, at least one part of the emitter electrode 780 is the emitter terminal 114, as one example. Also, at least one part of the emitter electrode 780 may be formed as an electrode pad. In a case where the semiconductor apparatus 300 is housed in a package and the like, at least one part of the emitter electrode 780 is electrically connected to terminals provided to the package by wire-bonding and the like.

The electrode portion 784 electrically connects the third well region 726 and the semiconductor film 750. As one example, the electrode portion 784 is formed in the contact hole that the third insulating film 770 forms and is in contact with the third well region 726.

As the above, FIG. 11 shows an example where the power semiconductor element 110 and the cutoff circuit 120 are formed on the substrate 700 as n channel type switches. It should be noted that the prevention circuit 210 described in FIG. 3 may be also formed as the n channel type MOSFET formed on the second surface side of the substrate, similar to the example of FIG. 11. In this case, for example, the cutoff circuit 120 and the prevention circuit 210 respectively have the gate terminal, the drain element, and the source terminal provided on the second surface side of the substrate 700.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor apparatus, comprising:
    a power semiconductor element in which a gate is controlled in response to a control signal;
    a cutoff condition detection portion which detects whether a predetermined cutoff condition is met;
    a reset portion which outputs, in response to an input of a control signal that turns the power semiconductor element on, a reset signal that instructs to reset during a predetermined period;
    a latch portion which is reset in response to the reset signal and latches that an occurrence of the cutoff condition is detected after the reset;
    a cutoff circuit which controls the gate of the power semiconductor element to be at an OFF potential in response to latching of the occurrence of the cutoff condition by the latch portion; and
    a prevention circuit which prevents the gate of the power semiconductor element from being at an ON potential during a period of reset of the latch portion even if the cutoff condition is met.

2. The semiconductor apparatus according to claim 1, wherein
    the prevention circuit controls the gate of the power semiconductor element to be at an OFF potential during a period when the reset portion outputs the reset signal.

3. The semiconductor apparatus according to claim 1, wherein
    the prevention circuit controls the gate of the power semiconductor element to be at an OFF potential during a period when the cutoff condition detection portion detects an occurrence of the cutoff condition.

4. The semiconductor apparatus according to claim 1, wherein the cutoff circuit and the prevention circuit electrically connect the gate and an emitter of the power semiconductor element respectively and make the gate of the power semiconductor element be at an OFF potential.

5. The semiconductor apparatus according to claim 1, wherein
the prevention circuit controls the gate of the power semiconductor element to be at an OFF potential in response to a logic sum of a cutoff signal and the reset signal, the cutoff signal being output from the latch portion and instructing to control the gate of the power semiconductor element to be at an OFF potential.

6. The semiconductor apparatus according to claim 5, wherein
the prevention circuit has a logic sum circuit and supplies an operated logic sum to the cutoff circuit.

7. The semiconductor apparatus according to claim 1, wherein
the prevention circuit controls the gate of the power semiconductor element to be at an OFF potential in response to a logic sum of a cutoff signal and a detection signal, the cutoff signal being output from the latch portion and instructing to control the gate of the power semiconductor element to be at an OFF potential, the detection signal being output by the cutoff condition detection portion when detecting an occurrence of the cutoff condition.

8. The semiconductor apparatus according to claim 1, wherein
the latch portion keeps the control signal in a latched value as an operation power source.

9. The semiconductor apparatus according to claim 1, wherein
at least one of the cutoff condition detection portion and the reset portion uses the control signal as an operation power source.

10. The semiconductor apparatus according to claim 1, wherein
the cutoff condition detection portion determines that the cutoff condition is met in response to the power semiconductor element heated to a temperature equal to or greater than a reference temperature.

11. The semiconductor apparatus according to claim 1, wherein
the power semiconductor element has a collector terminal which is provided on a first surface side of a substrate, a gate terminal and an emitter terminal which are provided on a second surface side of the substrate, and
the cutoff circuit has a drain element and a source terminal which are provided on the second surface side of the substrate.

12. The semiconductor apparatus according to claim 1, wherein
the power semiconductor element is an IGBT (insulated gate bipolar transistor) or a vertical MOSFET.

13. The semiconductor apparatus according to claim 1, wherein
the semiconductor apparatus is an igniter which controls current flowing through an ignition coil in response to a control signal from outside.

* * * * *